US012571832B2

(12) United States Patent
Lin et al.

(10) Patent No.: US 12,571,832 B2
(45) Date of Patent: Mar. 10, 2026

(54) INSPECTION APPARATUS AND METHOD

(71) Applicant: Taiwan Semiconductor Manufacturing Co., Ltd., Hsinchu (TW)

(72) Inventors: Chia-Hong Lin, Hsinchu (TW); Yu-Ting Lin, Hsinchu (TW); Mill-Jer Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 161 days.

(21) Appl. No.: 18/168,502

(22) Filed: Feb. 13, 2023

(65) Prior Publication Data

US 2024/0027514 A1      Jan. 25, 2024

Related U.S. Application Data

(60) Provisional application No. 63/420,401, filed on Oct. 28, 2022, provisional application No. 63/390,578, filed on Jul. 19, 2022.

(51) Int. Cl.
G01R 31/265 (2006.01)

(52) U.S. Cl.
CPC ................................. G01R 31/2653 (2013.01)

(58) Field of Classification Search
CPC ........................... G01R 31/2653; G01N 23/00
USPC .................................. 324/501; 250/307, 311
See application file for complete search history.

(56) References Cited

U.S. PATENT DOCUMENTS

| | | | | |
|---|---|---|---|---|
| 11,199,508 B1 * | 12/2021 | Wu | ................... | G01N 21/9501 |
| 2009/0114817 A1 * | 5/2009 | Bullock | ............... | G01R 31/307 |
| | | | | 250/311 |
| 2016/0370425 A1 | 12/2016 | Stallcup et al. | | |
| 2020/0043764 A1 * | 2/2020 | Clark | ..................... | H01L 22/12 |

FOREIGN PATENT DOCUMENTS

| | | | |
|---|---|---|---|
| CN | 112018084 A | * 12/2020 | ......... G01R 31/2853 |
| CN | 113871315 A | * 12/2021 | |
| TW | 201037778 A | 10/2010 | |

\* cited by examiner

*Primary Examiner* — Arleen M Vazquez
*Assistant Examiner* — Robert P Alejnikov, Jr.
(74) *Attorney, Agent, or Firm* — Seed IP Law Group

(57)      ABSTRACT

A method includes: providing a first semiconductor device including a backside interconnection structure, the first semiconductor device being formed by a semiconductor process; and generating a physical failure analysis model by an inspection process. The inspection process includes: directing an electron beam toward the frontside of the first semiconductor device; and applying an electrical signal to an electrical contact of the first semiconductor device through an electrical path that goes through a shunt board attached to a switchable interface trace bank, the electrical contact being associated with a position of the electron beam. The method further includes: generating a parameter of a revised semiconductor process according to the physical failure analysis model and the semiconductor process; and forming a second semiconductor device by the revised semiconductor process using the parameter.

20 Claims, 16 Drawing Sheets

3000

Determine a region of a semiconductor device including a backside interconnection structure as having a defect by a first inspection tool — 3010

Identify the defect by directing an electron beam at the region while applying an electrical signal to electrical contacts in contact with the backside interconnect structure associated with the region via a shunt board coupled to a tester — 3020

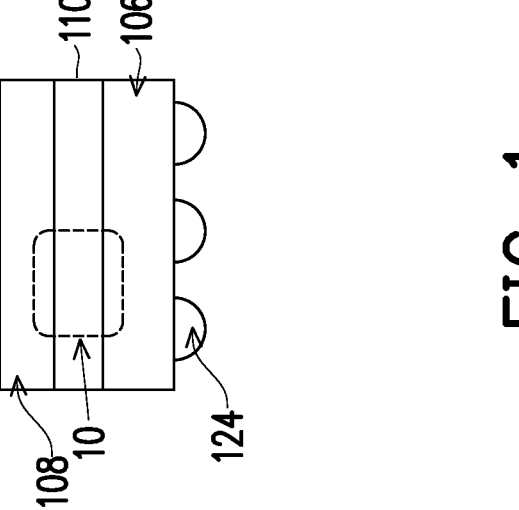
FIG. 1

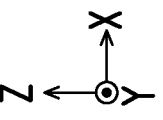
FIG. 2B

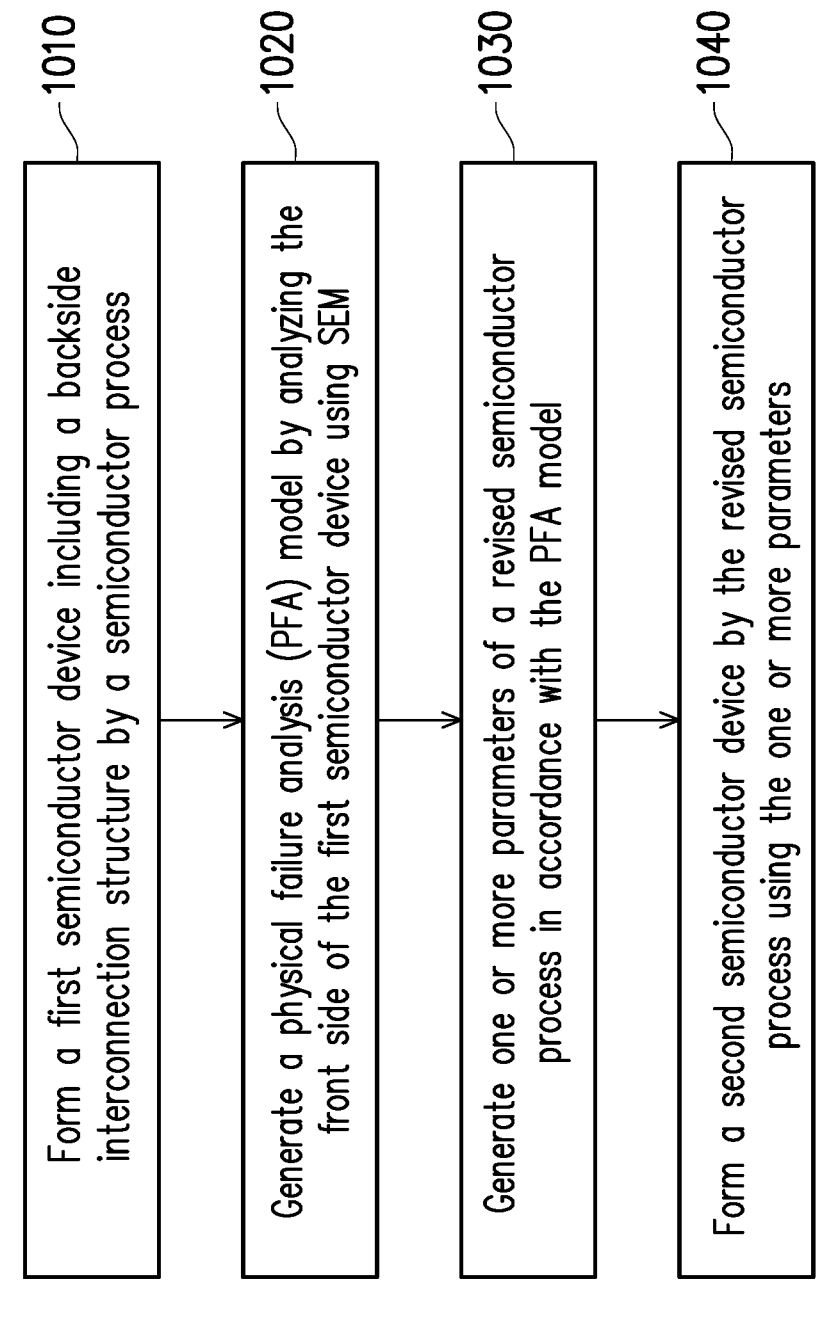

1000

1010 — Form a first semiconductor device including a backside interconnection structure by a semiconductor process 1020 — Generate a physical failure analysis (PFA) model by analyzing the front side of the first semiconductor device using SEM 1030 — Generate one or more parameters of a revised semiconductor process in accordance with the PFA model 1040 — Form a second semiconductor device by the revised semiconductor process using the one or more parameters

FIG. 10

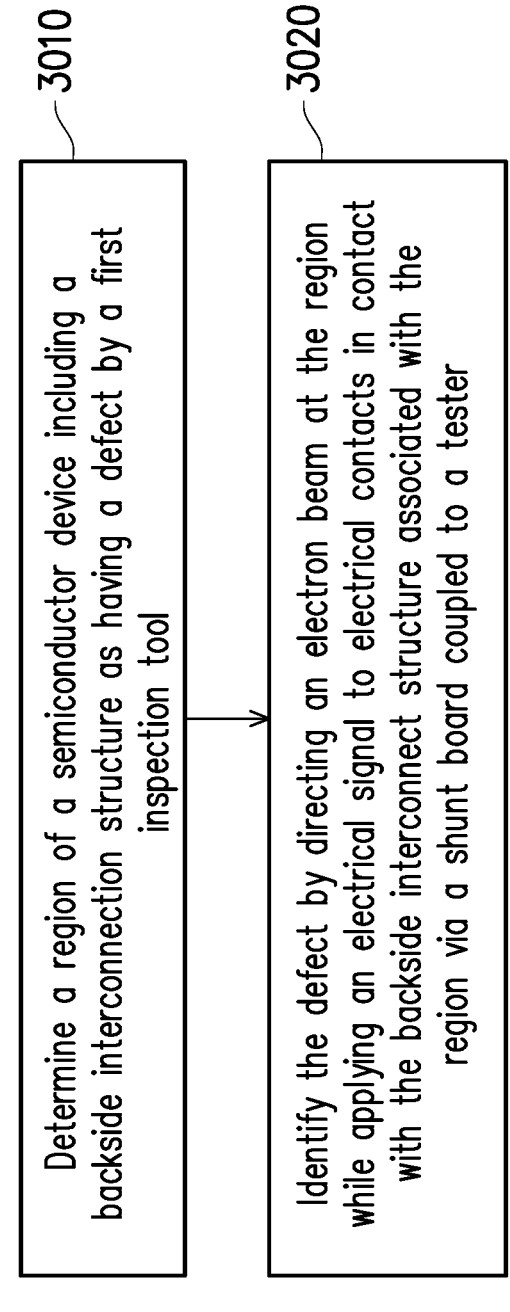

3010

Determine a region of a semiconductor device including a backside interconnection structure as having a defect by a first inspection tool

3020

Identify the defect by directing an electron beam at the region while applying an electrical signal to electrical contacts in contact with the backside interconnect structure associated with the region via a shunt board coupled to a tester

INSPECTION APPARATUS AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-2B are views of an integrated circuit chip according to embodiments of the present disclosure.

FIG. 10 is a flowchart of a method of forming a semiconductor device according to various aspects of the present disclosure.

FIGS. 11 and 12 are flowcharts of methods of inspecting a semiconductor device according to various aspects of the present disclosure.

DETAILED DESCRIPTION

Figure 2A:
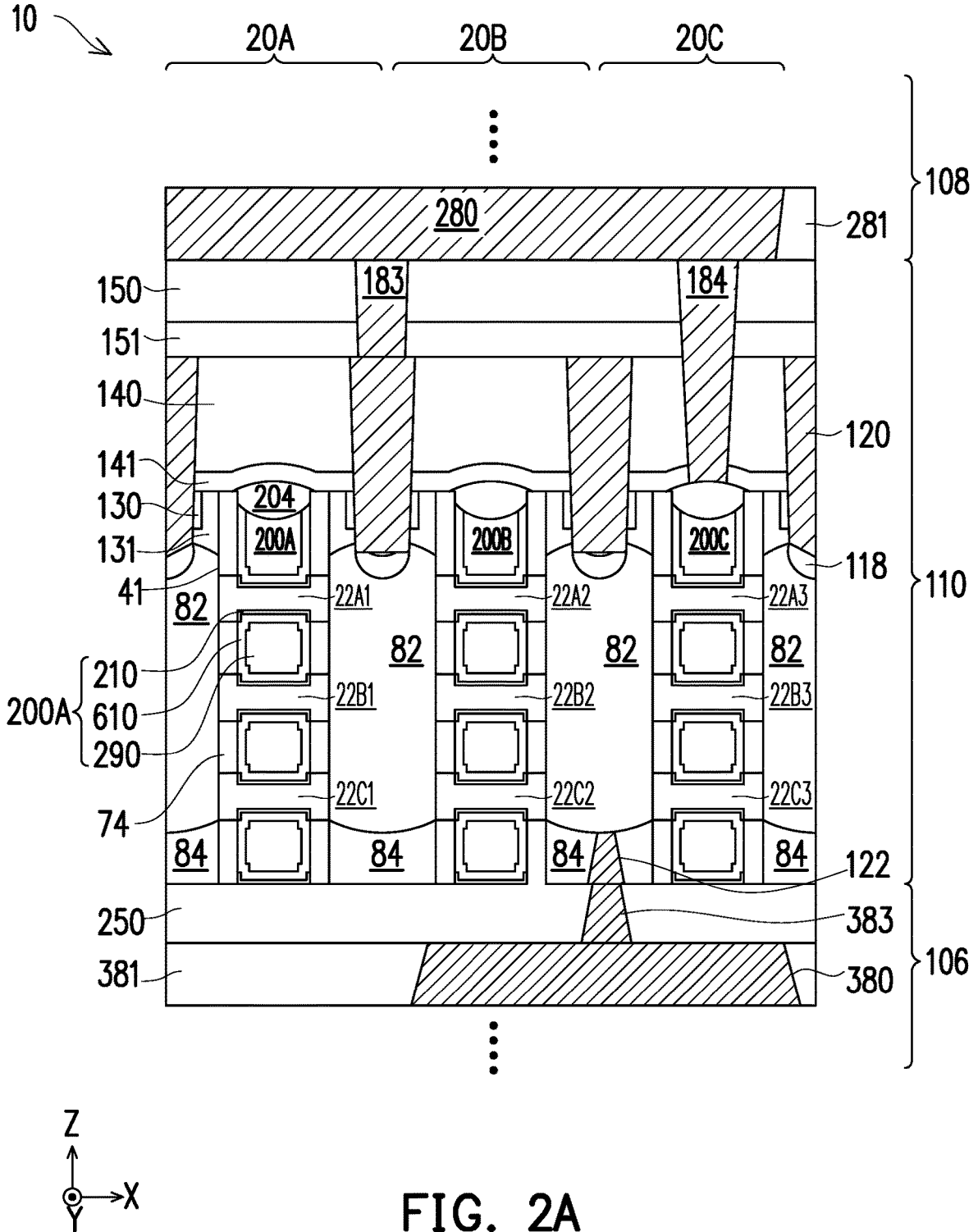

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms.

Semiconductor fabrication generally involves the formation of electronic circuits by performing multiple depositions, etchings, annealings, and/or implantations of material layers, whereby a stack structure including many semiconductor devices and interconnects between is formed. Dimension scaling (down) is one technique employed to fit ever greater numbers of semiconductor devices in the same area. However, dimension scaling is increasingly difficult in advanced technology nodes. Number of power interconnects (or "power rails") and signal interconnects may be insufficient when formed on a single side (e.g., a front side) of a die or chip. To alleviate routing constraints, one or more of the power interconnects may be formed on a backside of the die, and the resulting structure may be referred to as a "super power rail" (SPR) structure.

Chip dynamic fault isolation for dies free of backside interconnects may be performed from the chip backside using a final test load board and a fault isolation (FI) tool in an air environment. The FI tool may use laser scanning of transistors of the chip through the chip silicon backside. For chips having the SPR structure, the chip silicon backside is blocked by power lines and packaging, such that dynamic fault isolation is difficult to perform from the backside of the chip.

In embodiments of the present disclosure, the chip dynamic fault isolation may be performed from the chip front side by scanning electron microscopy (SEM) using e-beam probing on one or more metal layers in a vacuum chamber. A testing system in accordance with various embodiments includes e-beam probing for SPR chip failure analysis. A structure for PFA (physical failure analysis) using SEM can analyze a chip, such as an SPR chip, which is difficult to analyze from the backside using optical instruments, such as a laser. Embodiments of the disclosure describe SEM e-beam probing using a testing interface with automatic test equipment (ATE) for SPR chip scan dynamic fault isolation, which can improve SPR process quality.

In a method according to various embodiments, a physical failure analysis model for SPR semiconductor processing may be generated and/or updated by analyzing the front side of a first processed substrate (e.g., an SPR chip) using SEM. A second processed substrate may be formed by a semiconductor process having one or more parameters generated in accordance with the physical failure analysis model.

FIG. 1 is a cross-sectional diagram illustrating a semiconductor device 100, in accordance with some embodiments of the present disclosure. The semiconductor device 100 may be any semiconductor device, such as, but not limited to, a logic device, a memory device, or any other semiconductor device. As shown in FIG. 1, the device 100 includes a semiconductor device layer 110, a frontside interconnection structure 108, a backside interconnection structure 106 and one or more electrical contacts 124. In some embodiments, the device 100 may be a semiconductor device package, such as an integrated circuit (IC) chip.

The semiconductor device layer 110 may include a semiconductor substrate, which may be referred to as the substrate. The substrate may be any suitable substrate. In some embodiments, the substrate may be a semiconductor wafer. In some embodiments, the substrate may be a monocrystalline silicon (Si) wafer, an amorphous Si wafer, a gallium arsenide (GaAs) wafer, or any other semiconductor wafer.

The semiconductor device layer 110 includes one or more semiconductor devices. The semiconductor devices included within the semiconductor device layer 110 may be any semiconductor devices in various embodiments. In some embodiments, the semiconductor device layer 110 includes one or more transistors, which may include any suitable transistor structures, including, for example, planar transistors, fin-type transistors (FinFETs), or nanostructure transistors, such as gate-all-around (GAA) transistors, or the like. In some embodiments, the semiconductor device layer 110 includes one or more GAA transistors. In some embodiments, the semiconductor device layer 110 may be a logic layer that includes one or more semiconductor devices, and may further include their interconnection structures, that are configured and arranged to provide a logical function, such as AND, OR, XOR, XNOR, or NOT, or a storage function, such as a flipflop or a latch.

In some embodiments, the semiconductor device layer 110 may include a memory device, which may be any suitable memory device, such as, for example, a static random access memory (SRAM) device. The memory device may include a plurality of memory cells that are constructed in rows and columns, although other embodiments are not limited to this arrangement. Each memory cell may include multiple transistors (e.g., six) connected between a first voltage source (e.g., VDD) and a second voltage source (e.g., VSS or ground) such that one of two storage nodes can be occupied by the information to be stored, with the complementary information stored at the other storage node.

The semiconductor device layer 110 of the device 100 may further include various circuitry that is electrically coupled to the semiconductor device layer 110. For example, the semiconductor device layer 110 may include power management or other circuitry that is electrically coupled to the one or more semiconductor devices of the semiconductor device layer 110. The power management circuitry may include any suitable circuitry for controlling or otherwise managing communication signals, such as input power signals, to or from the semiconductor devices of the semiconductor device layer 110. In some embodiments, the power management circuitry may include power-gating circuitry which may reduce power consumption, for example, by shutting off the current to blocks of the circuit (e.g., blocks or electrical features in the semiconductor device layer 110) that are not in use, thereby reducing stand-by or leakage power. In some embodiments, the semiconductor device layer 110 includes one or more switching devices, such as a plurality of transistors, that are used to transmit or receive electrical signals to and from the semiconductor devices in the semiconductor device layer 110, such as to turn on and turn off the circuitry (e.g., transistors, etc.) of the semiconductor device layer 110.

The backside interconnection structure 106 is disposed at a backside of the semiconductor device layer 110, e.g., at the lower side as shown in FIG. 1. The backside interconnection structure 106 may include any suitable electrical interconnection structures, circuitry, wiring, or the like suitable to receive or transmit electrical signals to and from the semiconductor device layer 110.

In some embodiments, the backside interconnection structure 106 includes a backside power rail. The backside power rail may be disposed, for example, between a backside power delivery network and backside vias which may electrically couple the backside power rail to the semiconductor devices in the semiconductor device layer 110.

In some embodiments, the backside power rail of the backside interconnection structure 106 may include a plurality of conductive lines or power rails which operably deliver or receive electrical signals (e.g., power or voltage signals) to or from the semiconductor devices in the semiconductor device layer 110. The backside power rail may be formed of any suitable conductive material. In some embodiments, the backside power rail is formed of or includes a metal.

In some embodiments, the backside interconnection layer 106 further includes one or more metallization layers which may be electrically coupled to one another by one or more conductive vias. The metallization layers extend between electrical contacts 124 at the backside of the device 100 and the semiconductor device layer 110. In some embodiments, the metallization layers electrically connect the electrical contacts 124 to one or more semiconductor devices in the semiconductor device layer 110. The metallization layers may be electrically coupled to one another through one or more conductive vias.

The backside interconnection structure 106 may further include an insulation layer covering the various features, e.g., conductive features, of the backside interconnection structure 106. For example, an insulation layer may be included which covers or substantially covers the backside power rail, the backside vias, and the metallization layers of the backside interconnection structure 106. The insulation layer may be formed of any suitable insulation material, and in some embodiments, the insulation layer electrically insulates or isolates the various electrical features within the backside interconnection structure 106 from one another. In some embodiments, the insulation layer may be formed of a dielectric material, which may include one or more of silicon dioxide ($SiO_2$), SiON, SiOC and SiOCN or any other suitable insulating material. The insulation layer may be disposed on and in contact with the semiconductor device layer 110.

In some embodiments, the backside interconnection structure 106 has a thickness that is less than 10 μm. In some embodiments, the backside interconnection structure 106 has a thickness that is less than 5 μm, and in some embodiments, is within a range from 0.1 μm to 5 μm.

In some embodiments, the device 100 includes the frontside interconnection structure 108, which may be or include one or more metallization layers 108, and may be referred to as the one or more metallization layers 108. In some embodiments, the one or more metallization layers 108 have an overall thickness (e.g., between the semiconductor device layer 110 and the bonding layer 104) that is less than 10 μm. In some embodiments, the one or more metallization layers 108 have an overall thickness that is less than 5 μm, and in some embodiments, is within a range from 0.1 μm to 5 μm. The metallization layers 108 may each include a dielectric layer having metallization features (e.g., vias, wires, traces or the like) embedded therein. The dielectric layers may be low-k dielectric layers, such as $SiO_2$, SION, SiOC, SiOCN, or the like. The metallization features may be or include copper, tungsten, ruthenium, molybdenum, titanium, titanium nitride, other metals, alloys thereof, multilayer combinations thereof, or the like. The metallization layers 108 may be referred to as a back-end-of-line (BEOL) structure 108.

FIG. 2A is a detailed cross-sectional view of a region 10 of the chip or semiconductor device 100 of FIG. 1, in accordance with various embodiments.

The region 10 of the chip or semiconductor device 100 includes nanostructure devices 20A, 20B, 20C. The nanostructure devices 20A-20C may include at least an N-type FET (NFET), a P-type FET (PFET), or both, in some embodiments.

Referring to FIG. 2A, the nanostructure devices 20A-20C may be formed over and/or in a substrate, which may be removed fully or partially, where FIG. 2A illustrates a structure in which the substrate is fully removed, and is therefore not illustrated. The nanostructure devices 20A-20C generally include gate structures 200A, 200B, 200C straddling and/or wrapping around semiconductor channels 22A1-22C3, alternately referred to as "nanostructures," which may be separated by, isolation structures (e.g., shallow trench isolations, or "STIs," not illustrated in the view shown in FIG. 2A). The channels are labeled "22AX" to "22CX," where "X" is an integer from 1 to 3, corresponding to the three transistors 20A-20C, respectively. The channels 22A1-22C3 are abutted by respective source/drain regions 82. Each gate structure 200A-200C controls current flow between source/drain regions 82 through the channels 22A1-22C3. The channels 22A1-22C3 are optionally over a fin, not shown in FIG. 2A. In some embodiments, the fin is not present, for example, when the fin is removed in a process that forms the backside interconnect structure 106. Source/drain region(s) may refer to a source or a drain, individually or collectively dependent upon the context.

The channels 22A1-22C3 include a semiconductive material, for example silicon or a silicon compound, such as silicon germanium, or the like. In some embodiments, the fin structure includes silicon. The channels 22A1-22C3 are nanostructures (e.g., having sizes that are in a range of a few nanometers) and may also each have an elongated shape and extend in the X-direction. In some embodiments, the channels 22A1-22C3 each have a nano-wire (NW) shape, a nano-sheet (NS) shape, a nano-tube (NT) shape, or other suitable nanoscale shape. The cross-sectional profile of the channels 22A1-22C3 may be rectangular, round, square, circular, elliptical, hexagonal, or combinations thereof.

In some embodiments, the lengths (e.g., measured in the X-direction) of the channels 22A1-22C3 may be different from each other, for example due to tapering during a fin etching process. In some embodiments, length of the channel 22A1 may be less than a length of the channel 22B1, which may be less than length of the channel 22C1. The channels 22A1-22C3 each may not have uniform thickness, for example due to a channel trimming process used to expand spacing (e.g., measured in the Z-direction) between the channels 22A1-22C3 to increase gate structure fabrication process window. For example, a middle portion of each of the channels 22A1-22C3 may be thinner than the two ends of each of the channels 22A1-22C3. Such shape may be collectively referred to as a "dog-bone" shape, and is shown in FIG. 2A.

In some embodiments, the spacing between the channels 22A1-22C3 (e.g., between the channel 22B2 and the channel 22A2 or the channel 22C2) is in a range between about 8 nanometers (nm) and about 12 nm. In some embodiments, a thickness (e.g., measured in the Z-direction) of each of the channels 22A1-22C3 is in a range between about 5 nm and about 8 nm. In some embodiments, a width (e.g., measured in the Y-direction, orthogonal to the X-Z plane) of each of the channels 22A1-22C3 is at least about 8 nm.

The gate structures 200A-200C are disposed over and between the channels 22A1-22C3, respectively. In some embodiments, the gate structures 200A-200C are disposed over and between the channels 22A1-22C3, which are silicon channels for N-type devices or silicon germanium channels for P-type devices. In some embodiments, the gate structures 200A-200C include an interfacial layer (IL) 210, one or more gate dielectric layers 610, one or more work function tuning layers (not shown), and a metal core layer 290, which are shown and described in greater detail with reference to FIG. 2A.

The source/drain regions 82 may include SiB, SiGe, SiGeB, and may include dopants, such as Ge, Sb, B, or the like. In some embodiments, the source/drain regions 82 include silicon phosphorous (SiP). In some embodiments, the source/drain regions 82 have width (e.g., in the Y-axis direction) in a range of about 0.5 nm to about 100 nm. In some embodiments, height of the source/drain regions 82 (e.g., in the Z-axis direction) is in a range of about 0.1 nm to about 100 nm. The height of the source/drain regions 82 may be measured from the bottommost surface of the lowest channel 22C1, 22C2, 22C3 to a top of the source/drain region 82.

The nanostructure devices 20A-20C may include gate spacers 41 and inner spacers 74 that are disposed on sidewalls of the gate dielectric layer 610 and the IL 210. The inner spacers 74 are also disposed between the channels 22A1-22C3. The gate spacers 41 and the inner spacers 74 may include a dielectric material, for example a low-k material such as SiOCN, SiON, SIN, SiCN or SiOC. In some embodiments, one or more additional spacer layers are present abutting the gate spacers 41. In some embodiments, thickness of the inner spacers 74 (e.g., in the X-axis direction) is in a range of about 3 nm to about 10 nm. In some embodiments, thickness of the gate spacers 41 (e.g., in the X-axis direction) is in a range of about 3 nm to about 10 nm. The nanostructure devices 20A-20C may include bottom isolation structures 84 that are beneath the source/drain regions 82. In some embodiments, the bottom isolation structures 84 include a material such as SiOCN, SiON, SIN, SiCN or SiOC, and have thickness (e.g., in the Z-axis direction) of about 3 nm to about 10 nm. The bottom isolation structures 84 are optional, and are not present in some embodiments.

The nanostructure devices 20A-20C may include source/drain contacts 120 over one or more of the source/drain features 82. The source/drain contacts 120 may include a first liner layer, a second liner layer and a core layer, not specifically illustrated in FIG. 2A. The first liner layer may be a dielectric layer, such as SIN, SiCN, SiOCN, SiOC, or the like. In some embodiments, thickness of the first liner layer is in a range of about 3 nm to about 10 nm. The core layer may include a conductive material such as tungsten, ruthenium, cobalt, copper, molybdenum, or the like. The second liner layer is between the first liner layer and the core layer. In some embodiments, the source/drain contacts 120 have aspect ratio (e.g., height/width) in a range of about 1 to about 8. When the aspect ratio is over about 8, voids occurring when forming the source/drain contacts 120 may not be completely removed, and may be present in the source/drain contacts 120.

A silicide layer 118 may also be formed between the source/drain features 82 and the source/drain contacts 120, so as to reduce the source/drain contact resistance. In some embodiments, the silicide layer 118 is or includes one or more of nickel, cobalt, titanium, tantalum, platinum, tungsten, other noble metals, other refractory metals, rare earth metals or their alloys. For example, the silicide layer 118 may be TiSi, TiNiSi, NiSi, WSi, CoSi, MoSi, RuSi, or the like. In some embodiments, thickness of the silicide layer 118 (in the Z direction) is in a range of about 0.5 nm to about 10 nm, such as in a range of about 3 nm to about 10 nm. In some embodiments, height of the source/drain contacts 120 may be in a range of about 1 nm to about 100 nm, such as about 10 nm to about 100 nm.

The nanostructure devices 20A-20C include an interlayer dielectric (ILD) 130 and an etch stop layer 131. The ILD 130 provides electrical isolation between the various components of the nanostructure devices 20A-20C discussed above, for example between the gate structures 200A-200C and the source/drain contacts 120 therebetween. The etch stop layer 131 may be formed prior to forming the ILD 130, and may be positioned laterally between the ILD 130 and the gate spacers 41 and vertically between the ILD 130 and the source/drain features 82. In some embodiments, the etch stop layer 131 is or includes SiN, SiCN, SiC, SiOC, SiOCN, HfO$_2$, ZrO$_2$, ZrAlO$_x$, HfAlO$_x$, HfSiO$_x$, Al$_2$O$_3$, or other suitable material. In some embodiments, thickness of the etch stop layer 131 is in a range of about 1 nm to about 5 nm.

Overlying each of the gate structures 200A-200C are an optional gate capping conductive layer 204, a second ESL 141, the second ILD 140, a third ESL 151 and a third ILD 150. The gate capping conductive layer 204 may reduce contact resistance between a gate via 184 and the core layer 290 of the gate structures 200A-200C (e.g., the gate structure 200C in FIG. 2A). In some embodiments, the gate capping conductive layer 204 comprises a metal, such as tungsten, molybdenum, cobalt, ruthenium, or the like. The gate capping conductive layer 204 may include the same material as the core layer of the source/drain contacts 120. The gate capping conductive layer 204 may include the same material as the gate via 184. In some embodiments, thickness of a thickest part of the gate capping conductive layer 204 may be in a range of about 1 nm to about 10 nm. In some embodiments, the gate capping conductive layer 204 is a part of the gate structures 200A-200C.

The second and third ESLs 141, 151 may be similar in many respects to the ESL 131. In some embodiments, the third ESL 151 is thicker than the ESL 131, the second ESL 141, or both.

The second and third ILDs 140, 150 may be similar in many respects to the ILD 130. In some embodiments, the second ILD 140 is thicker than the ILD 130, the third ILD 150, or both.

As shown in FIG. 2A, one or more source/drain vias 183 and one or more gate vias 184 may land on source/drain contacts 120 and gate structures 200A-200C, respectively. In the example shown in FIG. 2A, the source/drain via 183 lands on the source/drain contact 120 between the nanostructure devices 20A, 20B. A gate via 184 lands on the gate structure 200C (e.g., lands on the conductive layer 204 on the gate structure 200C). The source/drain via 183 may be or include the same material as the source/drain contacts 120. For example, the source/drain vias 183 and the source/drain contacts 120 may be or include the same of one or more of W, Ru, Co, Cu, Ti, TiN, Ta, TaN, Mo, Ni, alloys thereof or the like. In the case of an alloy, the source/drain vias 183 and the source/drain contacts 120 may be or include alloys having both substantially the same elemental components and substantially the same ratio of the elemental components. By using substantially the same material for the source/drain contacts 120 and the source/drain vias 183, contact resistance is reduced between the source/drain contacts 120 and the source/drain vias 183, which enhances circuit performance of devices (e.g., the chip or semiconductor device 100) using the described configuration. In some embodiments, width of upper surfaces of the source/drain vias 183 (e.g., in the X-direction) is in a range of about 5 nm to about 40 nm. Sidewalls of the source/drain vias 183 may be substantially vertical (e.g., perpendicular with the major surface of the semiconductor device layer 110) or may be tapered, as shown in FIG. 2A.

The gate via 184 may include two or more of a glue layer, a metal liner layer and a metal core layer. The gate via 184 extends from an upper surface of the third ILD 150, through the third ILD 150, through the third etch stop layer 151 under the third ILD 150, through the second ILD and ESL 140, 141, to an upper surface of the conductive layer 204. Sidewalls of the gate via 184 are in contact with one or more of the second and third ESLs 141, 151 and the second and third ILDs 140, 150. The lower surface of the gate via 184 is in contact with the conductive layer 204.

In some embodiments, the glue layer is or includes one or more of TiN, TaN, Ru, or other suitable material. The glue layer may land on (e.g., be in direct physical contact with) the conductive layer 204 on the gate structure 200C. In some embodiments, thickness of the glue layer may be in a range of about 5 Angstroms to about 50 Angstroms. In some embodiments, the glue layer is not present.

In some embodiments, the metal liner layer is or includes one or more of W, Ru, Al, Mo, Ti, TiN, Cu, Co or other suitable material. In some embodiments, thickness of the metal liner layer may be in a range of about 2 nm to about 20 nm. In some embodiments, the metal liner layer is in direct contact with the conductive layer 204. In some embodiments in which the glue layer is present, the metal liner layer is in contact with the conductive layer 204 through an opening in the glue layer.

In some embodiments, the metal core layer has different composition than the metal liner layer, and is or includes one or more of W, Ru, Al, Mo, Ti, TiN, Cu, Co or other suitable material. In some embodiments, width of upper surfaces of the metal core layer (e.g., in the X-direction) is in a range of about 5 nm to about 40 nm. The metal core layer may be adjacent laterally and underneath to the metal liner layer. In some embodiments in which the glue layer, the metal liner layer, or both are present, the metal liner layer is in contact with the conductive layer 204 through an opening in the glue layer, an opening in the metal liner layer, or both.

A conductive feature 280 of the frontside interconnection structure 108 may be a metal wire or trace, is electrically connected to one or more of the gate structures 200A-200C by a respective gate via 184, and is electrically connected to one or more of the source/drain contacts 120 by a respective source/drain via 183. The conductive feature 280 may be embedded in a dielectric layer 281. The conductive feature 280 may be or include a material the same as or different from that of the source/drain contacts 120 (e.g., the core layer 120), the source/drain via 183, the gate via 184, the gate capping conductive layer 204, or any combination thereof. Thickness of the conductive feature 280 may be in a range of about 5 nm to about 50 nm. The dielectric layer 281 may be or include SiCN, SiO, SiCON, SiN, SiC or other low-k dielectric material (e.g., k<3.9). Height of the source/drain via 183 may be in a range of about 3 nm to about 30 nm. Height of the gate via 184 may be in a range of about 10 nm to about 70 nm. In some embodiments, the conductive feature 280 is a first metallization layer of the metallization layers 108, and additional metallization layers are stacked vertically over the first metallization layer to provide electrical interconnection between one or more of the nanostructure devices 20A-20C and other nanostructure devices of the chip or semiconductor device 100.

A conductive feature 380 of the backside interconnection structure 106 may be a metal wire or trace, is electrically connected to one or more of the source/drain regions 82 by a respective backside contact 122 and a respective backside via 383. The conductive feature 380 may be embedded in a dielectric layer 381. The conductive feature 380 may be or include a material the same as or different from that of the source/drain contacts 120 (e.g., the core layer 120), the source/drain via 183, the gate via 184, the gate capping conductive layer 204, or any combination thereof. Thickness of the conductive feature 380 may be in a range of about 5 nm to about 50 nm. The dielectric layer 381 may be or include SiCN, SiO, SiCON, SiN, SiC or other low-k dielectric material (e.g., k<3.9). In some embodiments, additional metallization layers are stacked vertically under the first backside metallization layer to provide electrical interconnection between one or more of the nanostructure devices 20A-20C and a power rail or a ground rail of the semiconductor device 100, or between one or more of the nanostructure devices 20A-20C and an external signal source, such as another IC chip, through the electrical contacts 124.

In some embodiments, the semiconductor device layer 110 includes layers and features of the structure between the backside interconnect structure 106 and the metallization layers 108, as shown by the bracket in FIG. 2A. For example, the layers and features may include the channels 22, the gate structures 200A-200C, the source/drain regions 82, the various spacers 41, 74, 84, the source/drain contacts 120, the source vias 183, the gate vias 184, and the various dielectric layers 130, 131, 140, 141, 150, 151, among other layers and features described in the preceding paragraphs.

FIG. 2B is another detailed cross-sectional view of the region 10 of the chip or semiconductor device 100 of FIG. 1, in accordance with various embodiments. The device layer 110 is simplified in the view of FIG. 2B.

As shown in FIG. 2B, the backside interconnect structure 106 includes a plurality of metallization layers 106A, 106B, 106C, 106D, . . . , 106I, 106J. Number of metallization layers in the backside interconnect structure 106 is not limited to that shown in FIG. 2B, and may be in a range of 2 to 16, or more. The metallization layer 106B includes a first trace or wire 380 that extends in a first direction (e.g., the X-axis direction), and the metallization layer 106D includes a second trace or wire 382 that extends in a second direction (e.g., the Y-axis direction) that may be transverse the first direction. The metallization layers 106I, 106J are bottom metallization layers, such that the metallization layer 106J is the metallization layer furthest the device layer 110 and nearest the electrical contacts 124. The metallization layer 106J includes pad features 385 that are in direct contact with the electrical contacts 124. The pad features 385 may be a single layer or a multilayer, and may extend below a dielectric layer 381J in which the pad features 385 are embedded. For example, portions of the pad features 385 may be in direct contact with a bottom surface of the dielectric layer 381J that faces the electrical contacts 124. Conductive vias 383 are disposed in the metallization layers 106A, 106C, 106I to connect vertically adjacent pairs of the first traces 380, the second traces 382 and the pad features 385 to each other.

The frontside interconnect structure 108 includes a plurality of metallization layers 108A, 108B, 108C, 108D, . . . , 108M, 108N. Number of metallization layers in the backside interconnect structure 106 is not limited to that shown in FIG. 2B, and may be in a range of 2 to 16, or more. The metallization layer 108B includes a first trace or wire 280 that extends in a first direction (e.g., the X-axis direction), and the metallization layer 108D includes a second trace or wire 282 that extends in a second direction (e.g., the Y-axis direction) that may be transverse the first direction. The metallization layers 106M, 106N are top metallization layers, such that the metallization layer 108N is the metallization layer furthest the device layer 110 of the metallization layers 108A-108N. The frontside interconnect structure 108 is generally free of electrical contacts 124. Conductive vias 283 are disposed in the metallization layers 108A, 108C, 108M to connect vertically adjacent pairs of the first traces 280 and the second traces 282 to each other.

Figure 3:
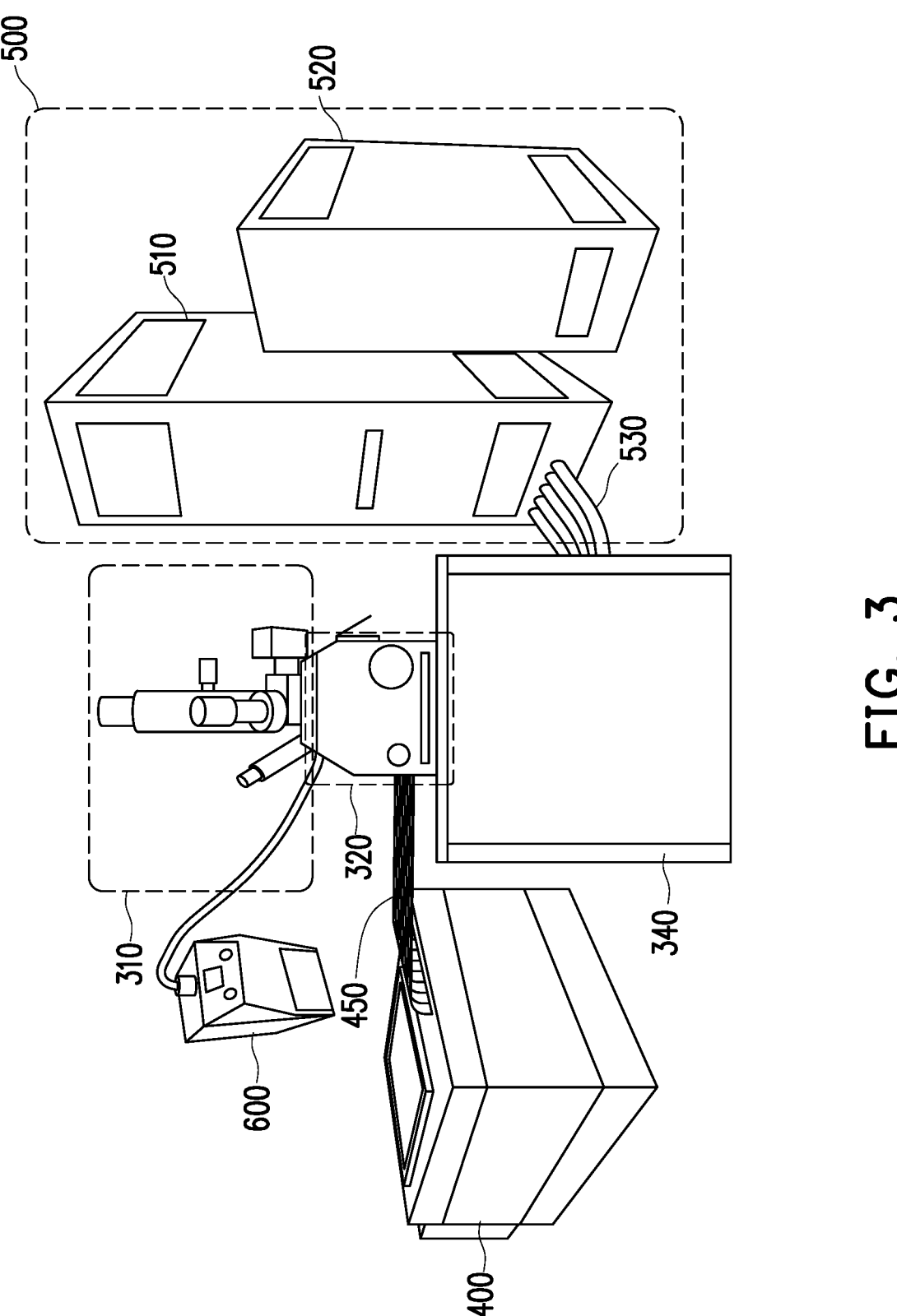
FIGS. 3-9B are views of an inspection apparatus according to various aspects of the present disclosure.
Figure 4:
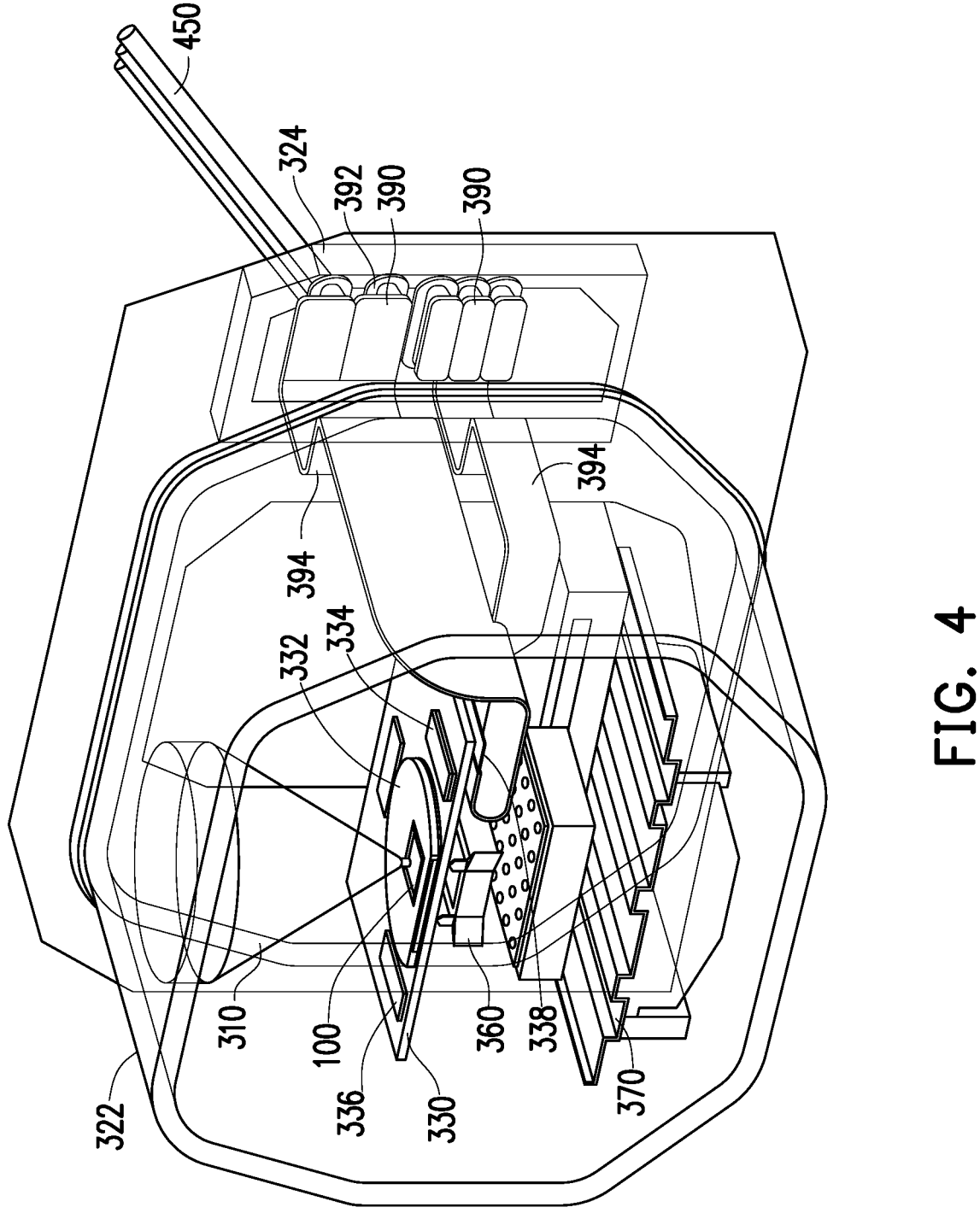

FIG. 3 is a schematic view of a system 30, according to various embodiments of the disclosure. FIG. 4 is a perspective cutaway view of an SEM vacuum chamber and device-under-test (DUT) board in accordance with various embodiments. The system 30 may be used to test a chip or die (or "device under test" or "DUT") 100, which may be the SPR chip 100 including one or more backside interconnects. The system 30 includes an SEM e-beam generator 310, an SEM vacuum chamber 320, a device-under-test (DUT) board 330 (see FIG. 4) and a tester 400. The system 30 may be connected to one or more electronics racks 500, such as a power supply and electronics rack 510 and an application electronics rack 520. The system 30 may be connected to a temperature controller 600. The system 30 may in electrical communication with (e.g., electrically connected to) the tester 400 by one or more cables 450.

The power supply and electronics rack 510 may be in electrical and fluid communication with one or more of the SEM vacuum chamber 320 and the SEM e-beam generator 310 via one or more electrical wires and pipes 530 connected to an SEM base 340 on which the SEM vacuum chamber 320 and the SEM e-beam generator 310 are disposed. The electrical wires and pipes 530 may include electrical wires for delivering power and electrical signals to one or more of the SEM vacuum chamber 320 and the SEM e-beam generator 310, and may also include one or more pipes in fluid communication with the SEM vacuum chamber 320, for example, for connecting to a roughing pump that establishes rough vacuum in the SEM vacuum chamber 320. Establishing vacuum in the SEM vacuum chamber 320 is advantageous for use of e-beam to perform testing.

The temperature controller 600 may be external temperature controller in electrical connection with the SEM vacuum chamber 320 for controlling temperature of the SEM vacuum chamber 320.

The SPR chip 100 may tested in association with various aspects of die manufacturing. For example, the SPR chip 100 may be tested to determine whether the SPR chip 100 is a "bad" die that should be scrapped. The SPR chip 100 may be tested by testing the electrical characteristics (e.g., resistance, capacitance, leakage, and/or frequency) of the integrated circuits on the SPR chip 100. In some testing approaches, the tester 400, which may be automated and referred to as an automated test equipment (ATE) module, is used to apply a voltage to a first pad (e.g., one of the electrical contacts 124) of the DUT 100. The DUT board 330, which may be a circuit board, may be used to connect the ATE 400 and the DUT 100, for example, by using contacts that mate with the corresponding electrical contacts of DUT 100. Through the application of a voltage, a current is achieved between the first electrical contact 124 and a second electrical contact 124 of the DUT 100 which is also connected to the ATE 400 through the DUT board 330, and the current can be measured. Alternatively, a current can be applied, and a voltage drop can be measured. Regardless of the specific test approach, data that is thus collected by the ATE 400 can be used to determine electrical characteristics of the DUT 100.

In embodiments of the disclosure, the SEM e-beam generator 310 may include an electron source and a column for directing a beam of electrons (or "electron beam") generated by the electron source to a surface of the DUT 100. The electrons may be scattered by backscattering or secondary scattering. When the electrons of the electron beam are scattered, current or voltage perturbations may be generated in the current or voltage being measured by the ATE 400 through the DUT board 330. In many applications, the electron beam is directed at the backside of the DUT 100. However, presence of the backside interconnection structure 106 in the SPR chip 100 obstructs access to chip silicon by the electron beam, such that directing the electron beam at the frontside of the SPR chip 100 is advantageous when performing dynamic fault isolation of the SPR chip 100, for example, when scanning transistors such as the nanostructure devices 20A-20C for defects. The defects may include one or more of voids, bridges, scratches, residues, particles, thinning or the like.

FIG. 4 is a perspective view of the SEM vacuum chamber 320 in accordance with various embodiments. The SEM vacuum chamber 320 includes an SEM chamber wall or housing 322 and a door 324. The door 324 is operable to open for loading the DUT 100 into the SEM vacuum chamber 320, and to close and form a seal (e.g., to the SEM chamber wall 322) for establishing a vacuum in the SEM vacuum chamber 320.

The DUT 100 may be loaded onto a DUT board 330. The DUT board 330 may be a printed circuit board (PCB). In some embodiments, the SEM vacuum chamber 320 has horizontal dimensions less than about 40 cm×40 cm, and the DUT board 330 may have horizontal dimensions smaller than those of the SEM vacuum chamber 320 and weight less than about 2.0 kg. In some embodiments, the DUT board 330 has dimensions of about 28.2 cm by 28.2 cm, and weight less than about 1.9 kg, less than about 1.5 kg, or less than about 1.0 kg. For example, the DUT board 330 may have weight of about 850 grams, thickness in a range of about 5.3 mm to about 5.9 mm, and may include 30 layers to 80 layers, such as about 60 layers. In some embodiments, the DUT board 330 may have total electrical current capacity that is no greater than 50 Ampere.

The DUT board 330 includes a socket 332, which may be referred to as a physical failure analysis (PFA) socket 332. The socket 332 may have weight in a range of about 27 grams to about 39 grams, such as about 33 grams, such that total weight of the DUT board 330 plus the socket 332 may be about 883 grams. The weight of the DUT board 330 including the socket 332 being less than about 2.0 kg allows for use of a smaller stage, such as a 6 inch stage 370, and smaller actuators for moving the stage 370.

The stage 370 is attached to the DUT board 330 by the spacer 360, and is operable to move (e.g., translate) the DUT board 330 and thereby move the DUT 100 in two horizontal directions (e.g., X and Y directions) and one vertical direction (e.g., Z direction). By moving the DUT 100, the electron beam may be directed to a selected region of the DUT 100. In some embodiments, the SPR chip 100 on the DUT board 330 is inserted into the SEM vacuum chamber 320 and the DUT board 330 is fastened to the stage 370 of the SEM vacuum chamber 320 by the spacer 360. The fastening may be at four locations of the stage 370 of the SEM vacuum chamber 320. The spacer 360 may have criss-cross shape (shown in FIG. 7) and be aluminum, so as to have robust fixing and light weight.

The DUT 100 is electrically connected to the tester 400 for performing defect isolation by the tester 400 while the electron beam is incident on the DUT 100. Electrical connection between the DUT 100 and the tester 400 may include one or more electrical paths. For example, the DUT 100 may be electrically connected to internal electrical traces of the DUT board 330 by the socket 332. The socket 332 may have electrical contacts that correspond to the electrical contacts 124 of the DUT 100.

In some embodiments, the DUT 100 may have more than 1000 electrical contacts 124, more than 1500 electrical contacts 124, or more than 2000 electrical contacts 124. Due to size of the DUT board 330, the DUT board 330 may have about 400 to about 500 pins for input/output (I/O) (e.g., 450 pins), and may have a further about 40 to about 80 pins for power (e.g., 64 pins). In some embodiments, the DUT board 330 may have an additional about 40 to about 80 pins for a low voltage, such as a ground or VSS voltage. In some embodiments, the DUT board 330 has dummy pins for loopback time delay calibration. Generally, the DUT board 330 includes fewer pins than the number of electrical contacts 124 of the DUT 100. In some embodiments, the DUT board 330 has fewer than half the number of pins as the number of electrical contacts 124 of the DUT 100. As such, the DUT board 330 further includes two or more (e.g., three) switchable interface trace banks 336 therein, which are operable to be switched on (e.g., shunted) by a shunt board 334, which may be referred to as a partition power switch 334. When the shunt board 334 is connected to one of the switchable interface trace banks 336, electrical connection is established between the electrical contacts 124 corresponding to the switchable interface trace bank 336 and one or more interconnect cables 394.

In some embodiments, the shunt board 334 is a printed circuit board. The shunt board 334 may include one or more pairs of solder balls that are shorted to each other by respective traces that are disposed in the printed circuit board. Each pair of solder balls of the shunt board 334 may contact a corresponding pair of electrical contacts on the DUT board 330 that are physically and electrically isolated from each other, such that the pair of solder balls and corresponding trace of the shunt board 334 electrically connects one of the electrical contacts 124 of the DUT 100 to one of the cables 450. The shunt board 334 may have hundreds of pairs of solder balls, such as about 500 pairs of solder balls. The number of pairs of solder balls may be equal to or greater than the number of pins of the DUT board 330. Use of the shunt board 334 may be advantageous to establish metal routing to different areas of the DUT 100. As one non-limiting example, the shunt board 334 may be attached to one of three switchable interface trace banks 336 to establish electrical connection to a system-on-a-chip region, a graphics processor (GPU) region, a central processor (CPU) region, or other similar region of the DUT 100.

The interconnect cables 394 are connected to an opposite side of the DUT board 330 than the DUT 100, for example, by one or more connectors 338. Locating the connectors 338 on the backside of the DUT board 330 opposite the frontside on which the DUT 100 is attached is advantageous for a number of reasons. The interconnect cables 394 are flexible cables, and connecting the interconnect cables 394 to the backside of the DUT board 330 avoids the interconnect cables 394 hitting the SEM e-beam generator 310 when the DUT board 330 is moved by the stage 370. Another advantage of locating the connectors 338 on the backside of the DUT board 330 is to provide balance to the DUT board 330 during movement by offsetting weight of the shunt board 334, which is attached on the frontside of the DUT board 330.

Figure 5A:
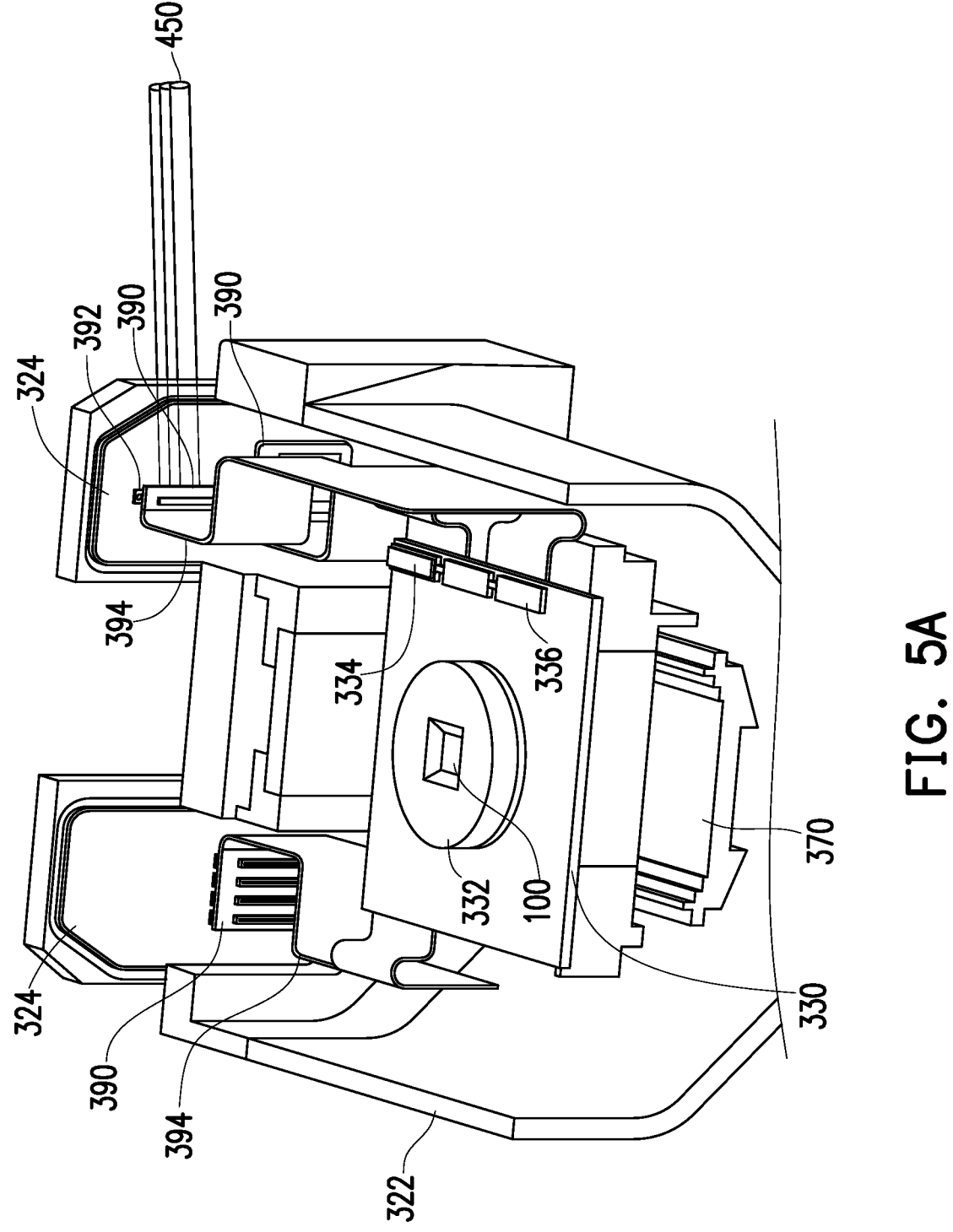

As shown in FIG. 5A, the interconnect cables 394, which are flexible cables, extend horizontally outward from the connectors 338, then extend horizontally along the SEM chamber wall 322 toward the door 324. The interconnect cables 394 then extend parallel to the door 324, and connect to door connectors 392 by cable connectors 390. The door connectors 392 are electrical connectors that extend through the door 324, and face outward from the SEM vacuum chamber 320 for connecting to the cables 450.

Figure 5B:
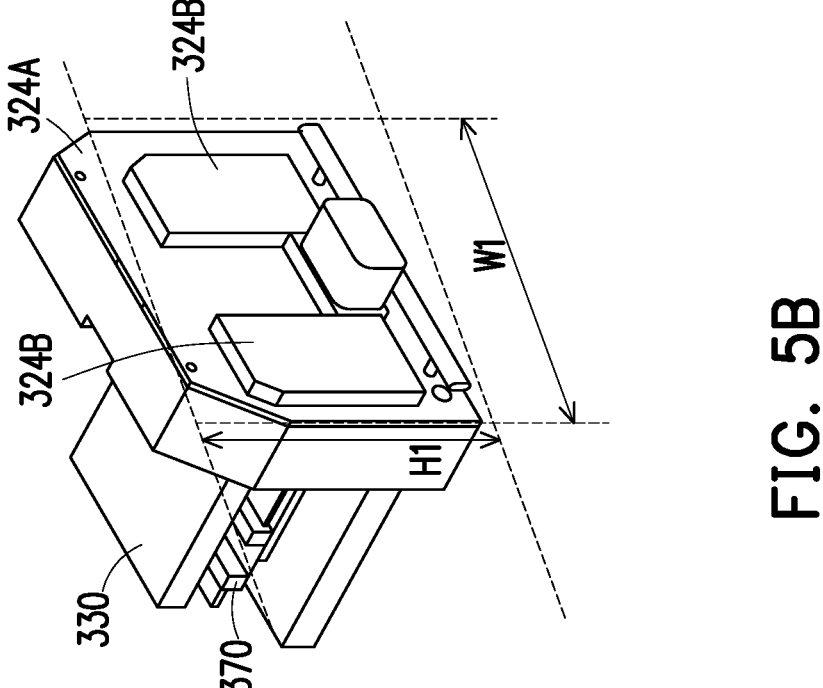

The door 324 is shown in FIG. 5B. In some embodiments, the door 324 has height H1 and width W1. The height H1 may be in a range of about 18 cm to about 24 cm, such as about 21 cm, or 20.6 cm. The width W1 may be in a range of about 8 cm to about 14 cm, such as about 11 cm, or 10.6 cm. The door 324 may include an SEM stage door 324A including a faceplate and sidewalls. The door 324 may further include one or more second doors 324B that are operable to form a seal with the SEM stage door 324A. In some embodiments, the door connectors 392 extend through the second doors 324B, and may be mated with connectors of or attached to the cables 450.

Figure 6:
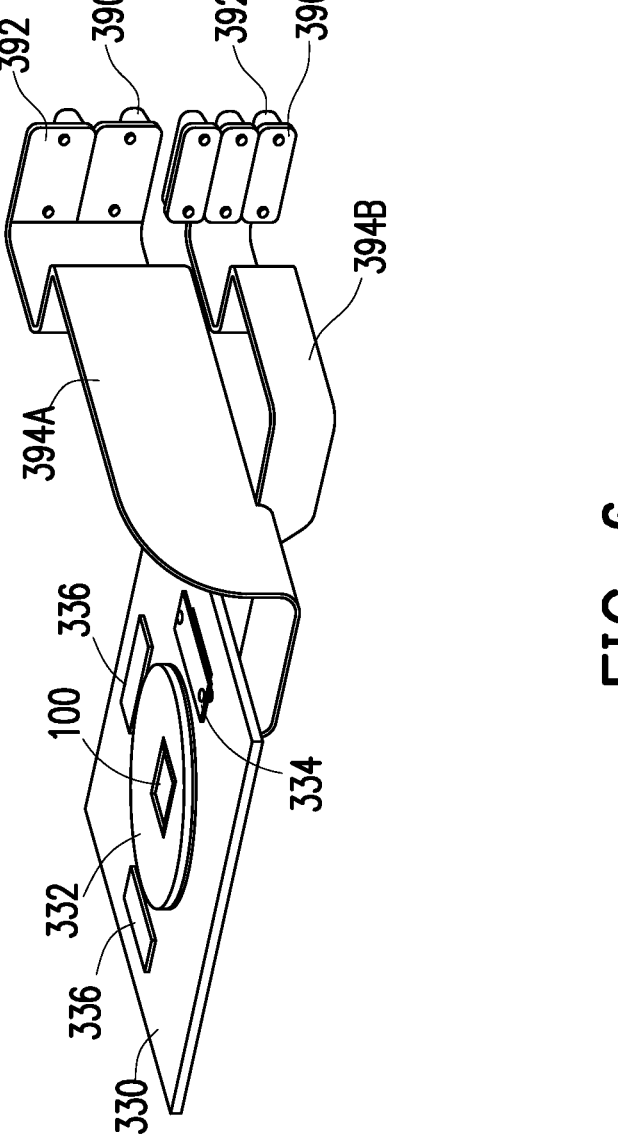

FIG. 6 is another view showing the DUT board 330, the interconnect cables 394, the cable connectors 390 and the door connectors 392, with the SEM vacuum chamber 320 and other components omitted from view for clarity of illustration. In some embodiments, the switchable interface trace banks 336 are disposed on three sides of the PFA socket 332, as shown in FIG. 6. In some embodiments, as shown in FIG. 5A, the switchable interface trace banks 336 are disposed on a single side of the PFA socket 332, for example, between the PFA socket 332 and the interconnect cables 394 on one side of the DUT board 330.

FIG. 6 also illustrates the interconnect cables 394 in accordance with various embodiments. As shown, each of the interconnect cables 394 may be connected to one or more of the cable connectors 390. For example, a first interconnect cable 394A may be connected to two of the cable connectors 390, and a second interconnect cable 394B may be connected to three of the cable connectors 390. In some embodiments, each of the interconnect cables 394 is a flexible cable that has length less than 30 inches, such as about 20 inches. Above about 30 inches, the interconnect cables 394 are likely to bump into the SEM e-beam generator 310, causing errors in fault detection.

Figure 7:
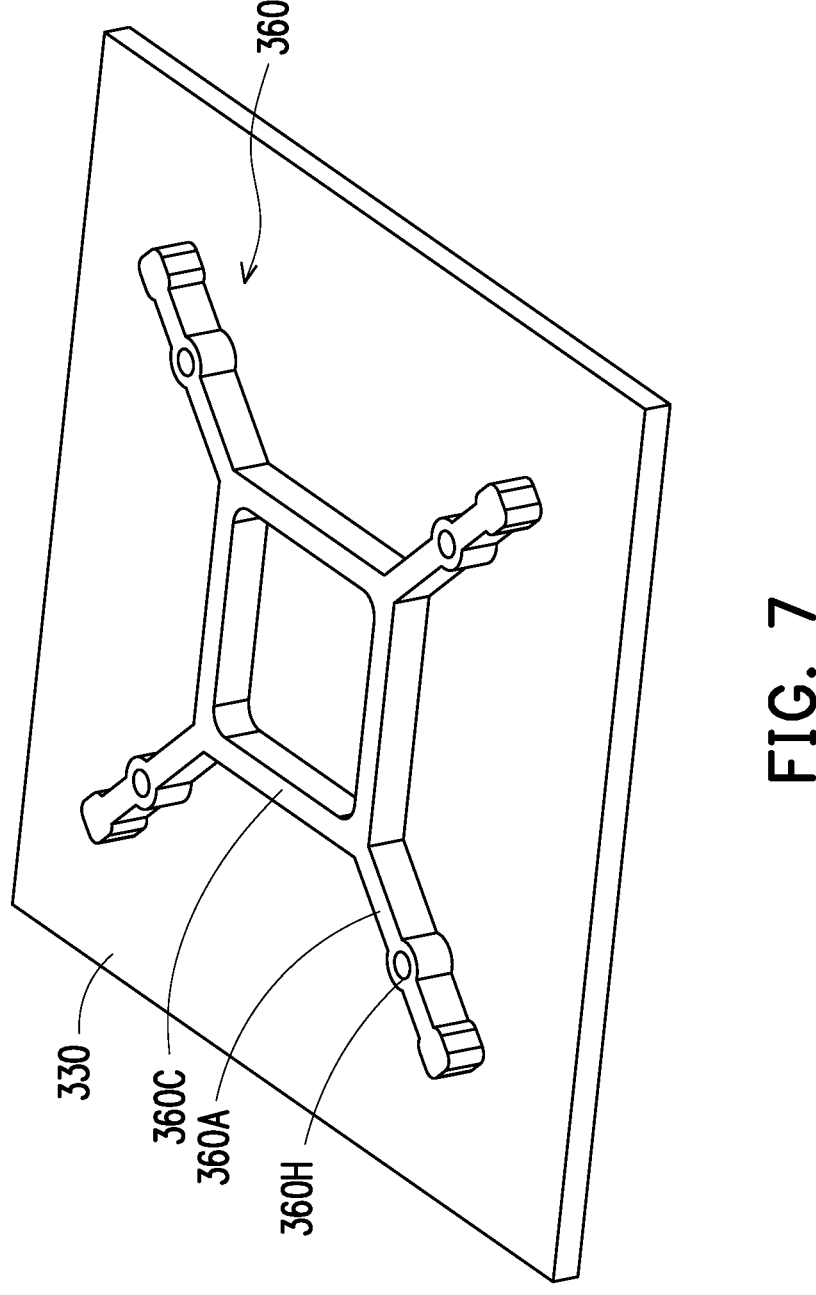

FIG. 7 is a simplified perspective diagram of the backside of the DUT board 330 and the spacer 360. In some embodiments, the spacer 360 includes a center portion 360C, four arm portions 360A, and four respective hole portions 360H disposed in the arm portions 360A. The center portion 360C may have a ring shape that overlaps a region associated with the DUT 100. In some embodiments, the center portion 360C is aligned with, is beneath, and laterally surrounds the DUT 100. It should be understood that "laterally surrounds" in this context does not require being in the same plane. For example, the center portion 360C may be beneath the DUT 100, which may be on the frontside of the DUT board 330, while laterally surrounding the vertical projection of the DUT 100 in the vertical direction. The arm portions 360A extend from corners of the center portion 360C, so as to form a criss-cross shape that provides advantageous support to the DUT board 330 when attached to the stage 370. The hole portions 360H may include threads for attaching fasteners, such as screws or bolts, to the DUT board 330 through the spacer 360, so as to attach the spacer 360 to the DUT board 330. The hole portions 360H may further be associated with protrusions in the stage 370 for attaching the spacer 360 to the stage 370. In some embodiments, the spacer 360 is aluminum or a similar material having good rigidity and light weight.

Figure 8A:
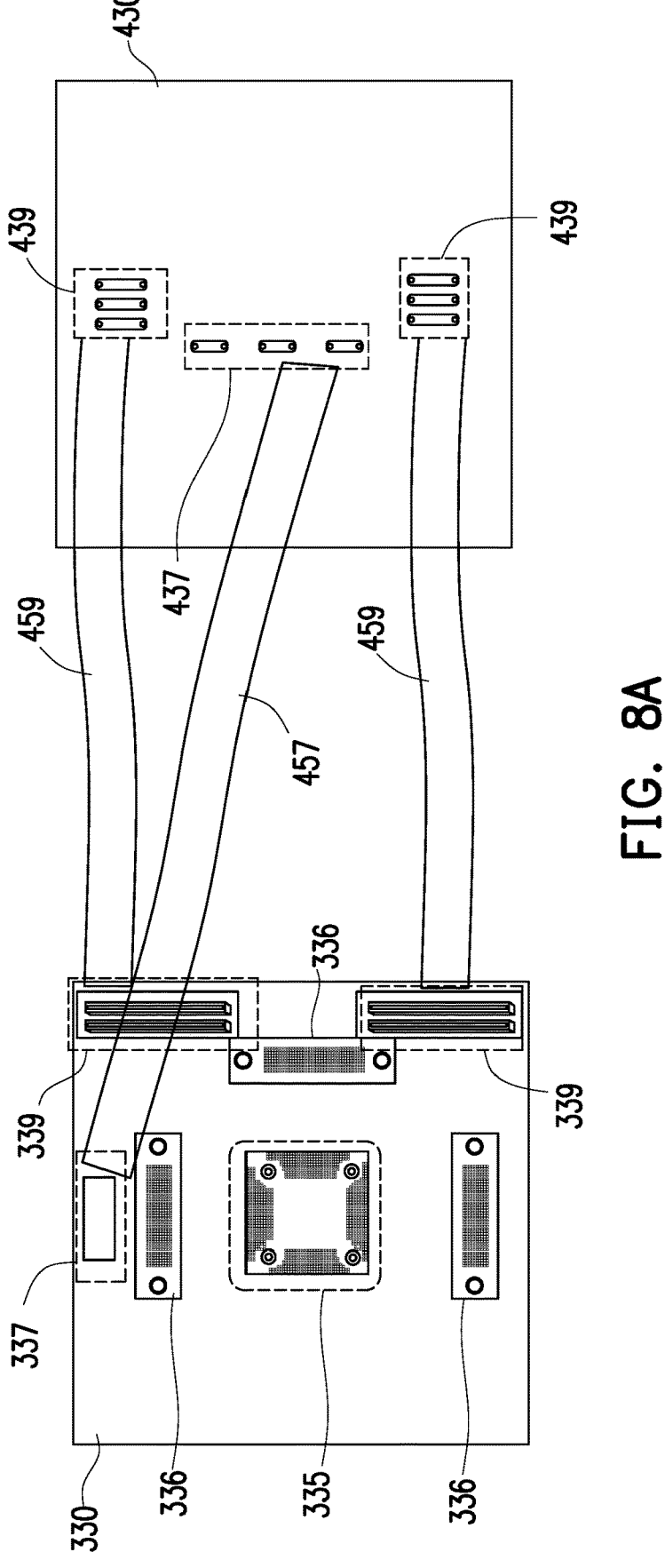
Figure 8B:
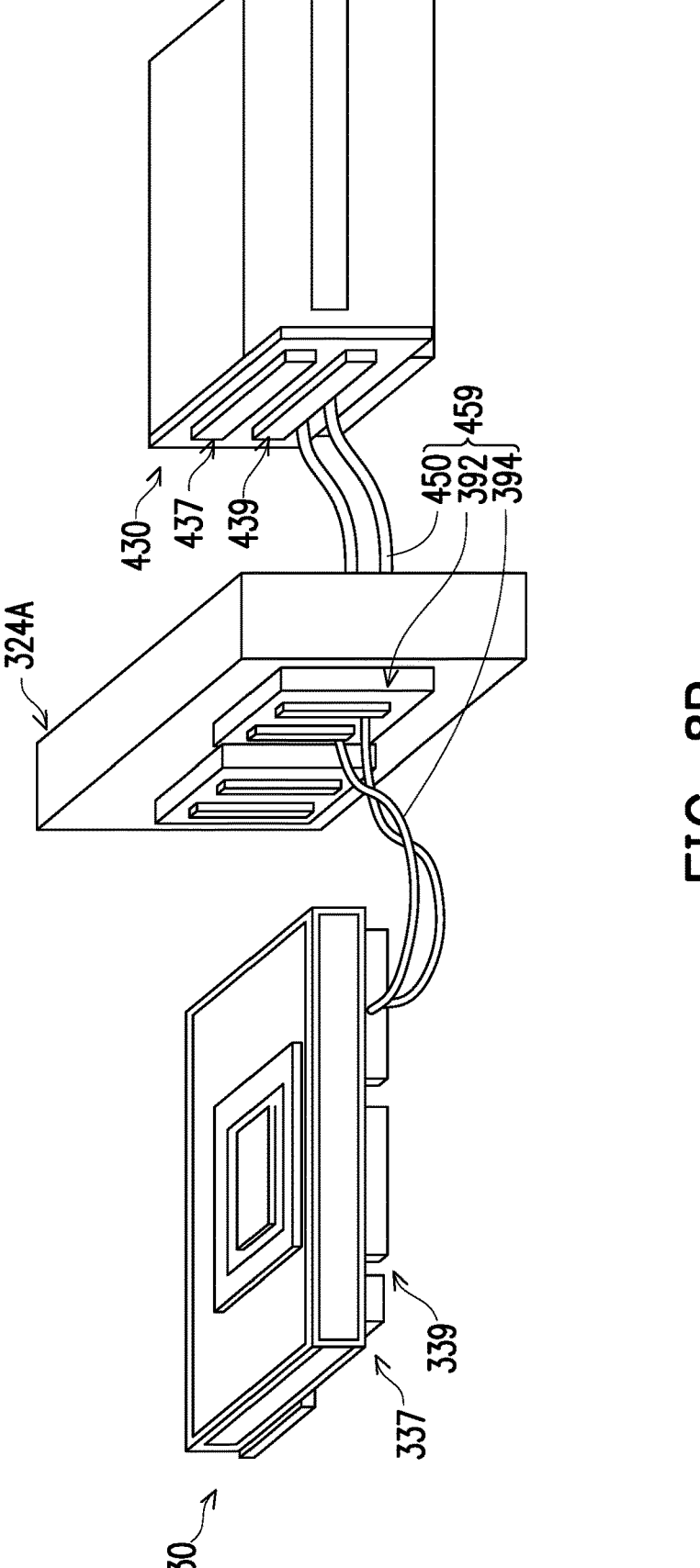
Figure 8C:
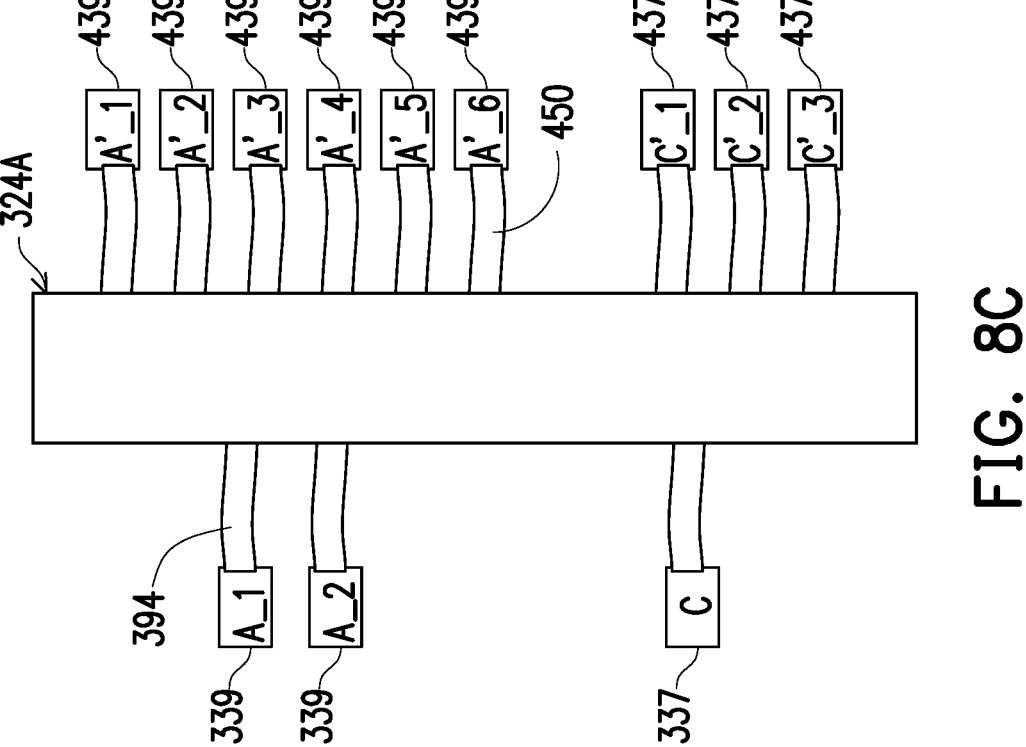

FIGS. 8A, 8B and 8C are diagrammatic views illustrating the DUT board 330 in data communication with a device interface board (DIB) 430 of the tester 400 in accordance with various embodiments. The tester 400 may include the DIB 430.

FIG. 8A shows first and second connectors 337, 339 of the DUT board 330. In some embodiments, the DUT board 330 includes one first connector 337 and one or more (e.g., two) second connectors 339. The first connector 337 may have fewer pins than either of the second connectors 339. In some embodiments, the first connector 337 is a 300-pin connector, and the second connectors 339 are each 500-pin connectors. Other numbers of pins may be used for the first connector 337 and the second connectors 339. The first and second connectors 337, 339 are disposed on (e.g., mounted on) the backside of the DUT board 330. The first and second connectors 337, 339 are connected to the switchable interface trace banks 336. The switchable interface trace bank 336 that the shunt board 334 is attached to electrically connects some of the electrical contacts 124 to the first and second connectors 337, 339, and others of the switchable interface trace banks 336 that the shunt board 334 is not attached to electrically isolate the remainder of the electrical contacts 124 from the first and second connectors 337, 339. As one non-limiting example, two second connectors 339 provide 1000 pins for signals and one first connector 337 provides 300 pins for power. In another example, each first and second connector 337, 339 may provide both signals and power. Each of the pins may be operable to carry a selected power, such as an electrical current of greater than 1.5 Amps (A), or another suitable current. Power supply inputs may include 64 direct current power supply (DPS) and 64 low power supply (VSS) or "ground" pins. Power supply inputs may be merged from 128 pins (e.g., each operable to carry 1.5A for a combined 3A), such that the power supply inputs include 128 DPS pins and 128 VSS pins. Interface (I/O) signals may be inputted and outputted over 450 pins, and sense signals may be outputted over 450 pins. Other numbers of pins for power supply inputs, interface signal inputs and outputs and sense signal outputs are contemplated in the embodiments.

The first connector 337 may be electrically connected to one or more third connectors 437 that are disposed on (e.g., mounted on) the DIB 430. In some embodiments, the DIB 430 includes three third connectors 437 that are electrically connected to the first connector 337. Each of the third connectors 437 may be a 51-pin connector, but number of pins of the third connectors 437 is not limited thereto. In some embodiments, the DIB 430 includes two groups of fourth connectors 439 that are electrically connected to the second connectors 339. Each of the fourth connectors 439 may be a 100-pin connector, but is not limited thereto.

Although not specifically illustrated in FIG. 8A, the DUT board 330 may include additional connectors beyond those shown in the figure. For example, the DUT board 330 may include three 400-pin female connectors, but the disclosure is not limited thereto.

The first and second connectors 337, 339, and any other connectors that are attached to the DUT board 330 are connectors that are operable in a vacuum environment.

As described with reference to FIG. 3, the tester 400 is in data communication with the SEM vacuum chamber 320 by one or more cables 450. The cables 450 may be long enough to cause a time delay that effects measurement of the DUT

100. As such, loopback time delay calibration may be performed to compensate for the time delay between the DIB 430 and the DUT board 330. Electrical signal paths 457, 459 between the third and fourth connectors 437, 439 and the first and second connectors 337, 339 are illustrated conceptually in FIG. 8A. In some embodiments, the loopback time delay calibration is a time domain reflectometry. The calibration may include measuring time for reflection of a pulse electromagnetic wave (e.g., a low voltage pulse) applied to one or more of the cables 450, such as cables 450 associated with dummy channels of the DUT board 330 or the DUT 100. For example, the tester 400 may apply a low voltage pulse to one or more pins of one or more of the third and fourth connectors 437, 439. The low voltage pulse(s) may then travel along the respective cables 450, through the interconnect cables 394 and to one or more pins of one or more of the first and second connectors 337, 339. The low voltage pulse(s) may reflect back to the one or more pins of the third and fourth connectors 437, 439, and the tester 400 may determine length of time between applying the low voltage pulse(s) and detecting the reflected low voltage pulse(s). Based on the length of time measured by the tester 400, the tester 400 may calibrate loopback time delay. The calibrated loopback time delay may be used during fault detection performed by the tester 400 while the SEM e-beam generator 310 is directing the electron beam to the DUT 100.

FIG. 8B is a diagrammatic view of the DUT board 330, the SEM stage door 324A and the DIB board 430 in accordance with various embodiments. Some components are omitted from view in FIG. 8B for simplicity of illustration. As shown, interconnect cables 394 are connected between the first and second connectors 337, 339 and the door connectors 392, and the cables 450 are connected between the door connectors 392 and the third and fourth connectors 437, 439. The electrical signal path 457 and the electrical signal paths 459 may each include one or more of the interconnect cables 394, the door connectors 392 and the cables 450.

FIG. 8C is a diagrammatic view that shows the first and second connectors 337, 339 electrically coupled to the third and fourth connectors 437, 439 through the interconnect cables 394, the SEM stage door 324A (e.g., via the door connectors 392) and the cables 450.

Figure 9B:
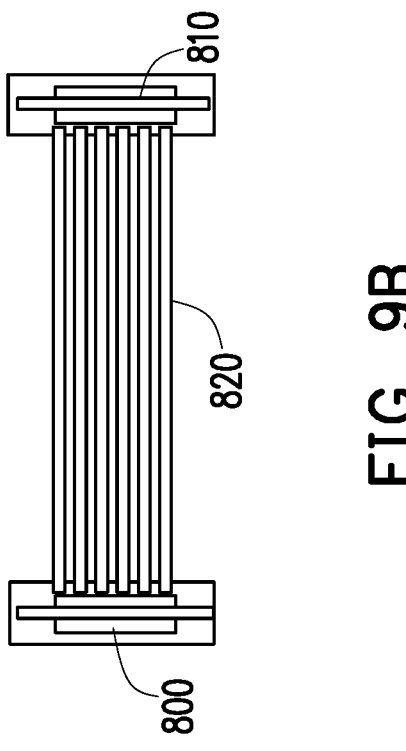
Figure 9A:
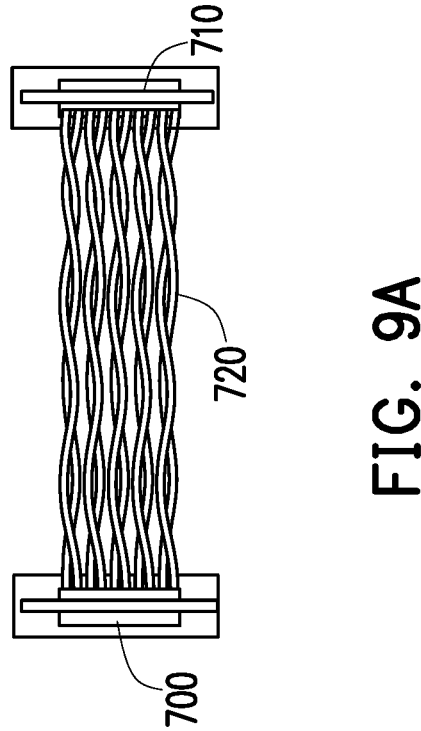

FIGS. 9A and 9B are diagrams of cables 720, 820 that may be used as the cables 450 in accordance with various embodiments. The cables 720 shown in FIG. 9A include twisted pairs connected between a first connector 700 and a second connector 710. The first connector 700 may correspond to the first connector 337 or the second connector 339, and the second connector 710 may correspond to the third connector 437 or the fourth connector 439.

The cables 820 shown in FIG. 9B include coaxial cables connected between a first connector 800 and a second connector 810. The first connector 800 may correspond to the first connector 337 or the second connector 339, and the second connector 810 may correspond to the third connector 437 or the fourth connector 439.

In some embodiments, the cables 720, 820 have length that is less than about 40 inches, such as 36 inches.

Figure 11:
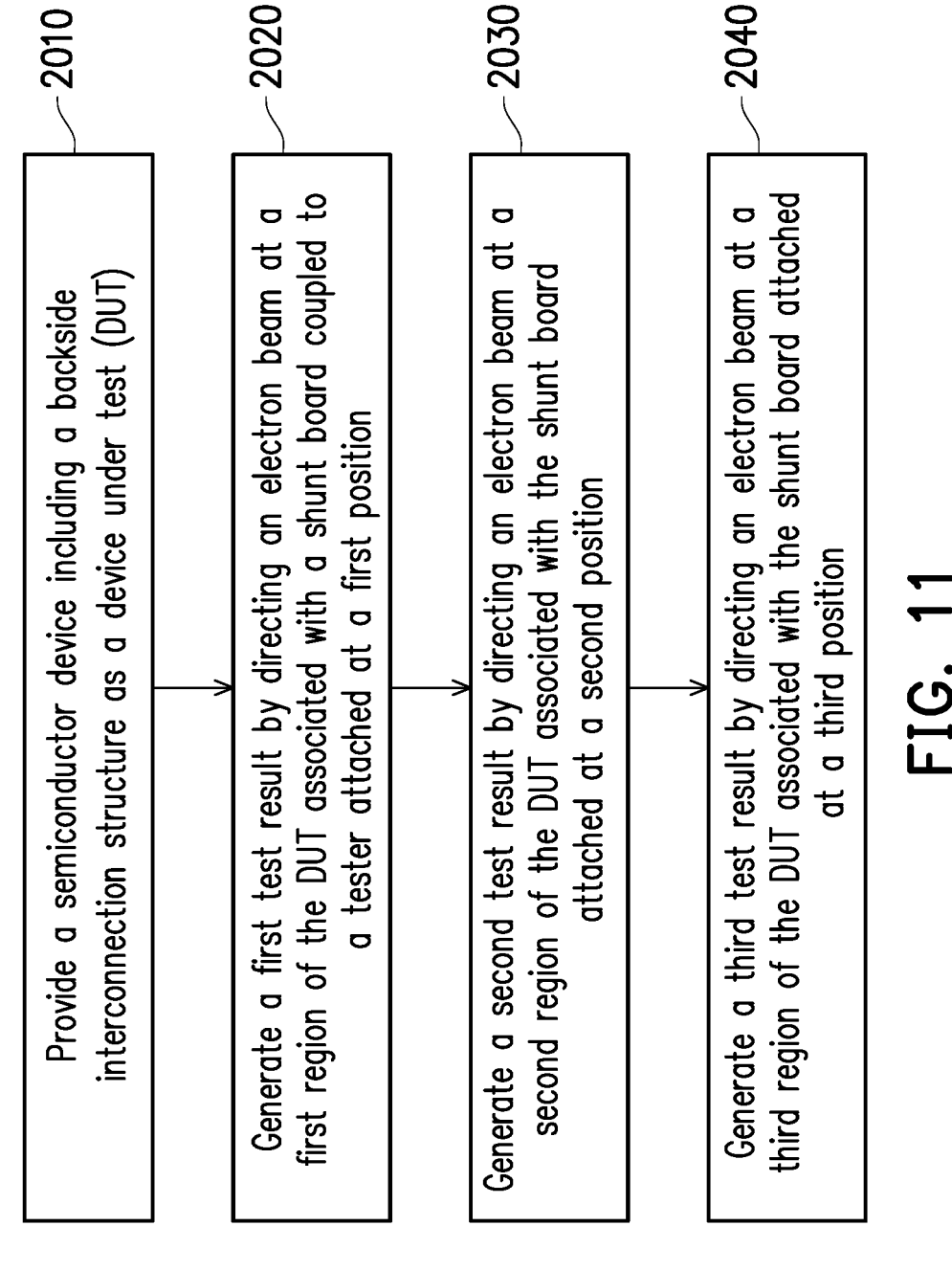

FIGS. 10-12 illustrate flowcharts of methods 1000, 2000, 3000 in accordance with various embodiments. FIG. 10 illustrates a method 1000 for forming a second semiconductor device based on a result of dynamic fault isolation performed on a first semiconductor device (e.g., the DUT 100) using an SEM e-beam system (e.g., the system 30 of FIG. 3) in accordance with various embodiments. FIG. 11 illustrates a method 2000 for performing dynamic fault isolation on a semiconductor device (e.g., the DUT 100) using an SEM e-beam system (e.g., the system 30 of FIG. 3) in accordance with various embodiments. FIG. 12 illustrates a method 3000 for performing dynamic fault isolation on a semiconductor device (e.g., the DUT 100) using an SEM e-beam system (e.g., the system 30 of FIG. 3) in accordance with various other embodiments. In some embodiments, the methods 1000, 2000, 3000 include a number of operations. The methods 1000, 2000, 3000 will be further described according to one or more embodiments. It should be noted that the operations of the methods 1000, 2000, 3000 may be rearranged or otherwise modified within the scope of the various aspects. It should further be noted that additional processes may be provided before, during, and after the methods 1000, 2000, 3000, and that some other processes may be only briefly described herein. It should be understood that the methods 1000, 2000, 3000 may be combined partially or in full in some embodiments. For example, either of the methods 2000, 3000 may be included in the method 1000, e.g., as part or all of operation 1020 of the method 1000.

In FIG. 10, optional operation 1010 begins with forming a first semiconductor device (e.g., the semiconductor device 100) including a backside interconnection structure by a semiconductor process. The backside interconnection structure may be similar to or the same as the backside interconnection structure 106 described with reference to FIG. 1. In some embodiments, instead of forming the first semiconductor device, operation 1010 may be providing or receiving the first semiconductor device. For example, the first semiconductor device may be formed by a semiconductor manufacturer, and operations 1020 and 1030 may be performed by the semiconductor manufacturer. In another example, the semiconductor device may be formed by a semiconductor manufacturer, and operations 1020 and 1030 may be performed by a failure analysis vendor, in which case the semiconductor device may be received by the failure analysis vendor in operation 1010.

The semiconductor process may include one or more semiconductor operations, such as deposition operations, etch operations, anneal operations, planarization operations, implantation operations, epitaxial growth operations, and the like.

In operation 1020, a physical failure analysis (PFA) model may be formed by analyzing the frontside of the first semiconductor device using an electron beam of an SEM e-beam system, such as the system 30. In some embodiments, the PFA analysis model may include one or more locations or regions of the DUT 100 identified as hotspots. For example, a hotspot may be a location in which a defect is found. The defect may include one or more of a void defect, a bridge defect, a particle defect, a residue defect, a scratch defect, a thinning defect, or the like. For example, the system 30 may perform a voltage contrast analysis on one or more regions of the DUT 100 by applying an electrical voltage or current to the DUT 100 through the cables 450 while the electron beam is directed to a location on the frontside surface of the DUT 100 associated with one or more electrical contacts 124 that receive the electrical voltage or current. The system 30 may then sense perturbations in the voltage or current that occur as the electron beam is scanned across the frontside surface of the DUT 100. In some embodiments, the system 30 may perform a secondary electron analysis on the one or more regions of the DUT 100.

Based on the PFA analysis model generated in operation 1020, one or more parameters of the semiconductor process are generated (e.g., revised) in operation 1030 to form a revised semiconductor process. For example, a deposition operation may include parameters such as precursor flow rates, temperature, pressure, and the like. Based on the type(s) and location(s) of the defect(s) of the PFA analysis model, one or more of the parameters may be generated to form the revised semiconductor process. For example, a pressure and/or a temperature and/or a growth time used in an epitaxial growth operation may each be reduced or increased to avoid merging (e.g., overgrowth) of neighboring source/drain regions 82.

In operation 1040, the one or more parameters of the revised semiconductor process are used to form a second semiconductor device. For example, the second semiconductor device may be the same as the first semiconductor device, but may have fewer defects due to being formed using the revised semiconductor process generated in operation 1030.

In FIG. 11, a method 2000 of performing dynamic fault isolation using an SEM e-beam system, such as the system 30, begins with providing a semiconductor device in operation 2010. The semiconductor device provided in operation 2010 may be similar to or the same as the semiconductor device 100 described with reference to FIGS. 1-2B. The semiconductor device includes a backside interconnection structure, which increases difficulty or renders impossible e-beam fault isolation from the backside of the semiconductor device.

In operation 2020, a first test result is generated by directing an electron beam at a first region of the DUT associated with a shunt board coupled to a tester. The shunt board may be attached at a first position of a DUT board to which the DUT is connected. For example, when performing the operation 2020 by the system 30, the shunt board 334 may be attached to one of the switchable interface trace banks 336, as shown in FIG. 6. The electron beam may be generated having a first radius and a first energy. For example, the first radius may be in a range of about 0.5 nm to about 10 nm, and the first energy may be in a range of tens of electron-volts (eV) to tens of kilo-electron-volts (keV). The first test result may be a location and type of a defect found by the tester by applying a voltage or current to electrical contacts of the DUT electrically connected to the shunt board while the electron beam scans across the frontside of the DUT.

In operation 2030, a second test result is generated by directing the electron beam at a second region of the DUT associated with the shunt board coupled to the tester, where the shunt board may be attached at a second position of the DUT board to which the DUT is connected. For example, when performing the operation 2030 by the system 30, the shunt board 334 may be attached to a different one of the switchable interface trace banks 336 shown in FIG. 6 than the one used in operation 2020. The electron beam may be generated having a second radius and a second energy, which may be the same as or different than the first radius and/or the first energy. For example, the second radius may be in a range of about 0.5 nm to about 10 nm, and the second energy may be in a range of tens of electron-volts (eV) to tens of kilo-electron-volts (keV). The second test result may be a location and type of a defect found by the tester by applying a voltage or current to electrical contacts of the DUT electrically connected to the shunt board while the electron beam scans across the frontside of the DUT.

In operation 2040, a third test result is generated by directing the electron beam at a third region of the DUT associated with the shunt board coupled to the tester, where the shunt board may be attached at a third position of the DUT board to which the DUT is connected. For example, when performing the operation 2040 by the system 30, the shunt board 334 may be attached to a different one of the switchable interface trace banks 336 shown in FIG. 6 than the one used in operation 2020 and the one used in operation 2030. The electron beam may be generated having a third radius and a third energy, which may be the same as or different than the first radius, the second radius, the first energy and/or the second energy. For example, the third radius may be in a range of about 0.5 nm to about 10 nm, and the third energy may be in a range of tens of electron-volts (eV) to tens of kilo-electron-volts (keV). The third test result may be a location and type of a defect found by the tester by applying a voltage or current to electrical contacts of the DUT electrically connected to the shunt board while the electron beam scans across the frontside of the DUT.

In some embodiments, it may be advantageous to combine use of the SEM e-beam system (e.g., the system 30) with another different inspection tool. The method 3000 illustrated in FIG. 12 begins in operation 3010 with determining a region of a semiconductor device as having a defect by a first inspection tool. The semiconductor device may have a backside interconnection structure, similar to the DUT 100 described with reference to FIGS. 1-2B. In some embodiments, the first inspection tool has lower resolution than the SEM e-beam system. The first inspection tool may identify a region containing a defect, but may have difficulty identifying a precise location of the defect. The region may be a portion of the DUT 100 associated with a group of electrical contacts 124 connected to one of the switchable interconnect trace banks 336.

Following identification of the region containing the defect, the DUT may be transferred to the SEM e-beam system, and operation 3020 may be performed to identify the defect by directing the electron beam at the region while applying an electrical signal to one or more electrical contacts associated with the region via the shunt board coupled to the tester. For example, the system 30 may perform a voltage contrast analysis on the region of the DUT 100 by applying an electrical voltage or current to the DUT 100 through the cables 450 while the electron beam is directed to a location in the region on the frontside surface of the DUT 100 associated with one or more electrical contacts 124 that receive the electrical voltage or current. The system 30 may then sense perturbations in the voltage or current that occur as the electron beam is scanned across the frontside surface of the DUT 100.

Embodiments may provide advantages. Dynamic fault isolation may be performed on the SPR chip 100 from the frontside of the DUT 100 by scanning electron microscopy (SEM) using e-beam probing on one or more metal layers of the frontside interconnection structure 106 in the SEM vacuum chamber 320. By using SEM, the system 30 can perform PFA from the frontside of the SPR chip 100, which is difficult to analyze from the backside using optical instruments, such as a laser.

In accordance with at least one embodiment, a method includes: providing a first semiconductor device including a backside interconnection structure, the first semiconductor device being formed by a semiconductor process; generating a physical failure analysis model by an inspection process including: directing an electron beam toward the frontside of the first semiconductor device; and applying an electrical signal to an electrical contact of the first semiconductor device through an electrical path that goes through a shunt board attached to a switchable interface trace bank, the electrical contact being associated with a position of the electron beam; generating a parameter of a revised semiconductor process according to the physical failure analysis model and the semiconductor process; and forming a second semiconductor device by the revised semiconductor process using the parameter.

In accordance with at least one embodiment, a method includes: providing a semiconductor device including a backside interconnection structure; attaching the semiconductor device to a device-under-test (DUT) board in a chamber; generating a first test result by directing a first electron beam at a first region of a frontside of the semiconductor device while applying a first electrical signal to a first electrical contact through a first electrical path, the first electrical path extending through a shunt board attached to a first switchable interface trace bank of the DUT board; and generating a second test result by directing a second electron beam at a second region of the frontside of the semiconductor device while applying a second electrical signal to a second electrical contact through a second electrical path, the second electrical path extending through the shunt board attached to a second switchable interface trace bank of the DUT board that is physically separated from the first switchable interface trace bank.

In accordance with at least one embodiment, a method includes: determining a region of a semiconductor device as having a defect by a first inspection tool, the semiconductor device having a frontside interconnection structure and a backside interconnection structure; and identifying the defect by directing an electron beam onto the frontside interconnection structure at the region while applying an electrical signal to an electrical contact associated with the region via an electrical path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

providing a first semiconductor device including a backside interconnection structure, the first semiconductor device being formed by an initial semiconductor process;

generating a physical failure analysis model by an inspection process including:

directing an electron beam toward a frontside of the first semiconductor device; and applying an electrical signal to an electrical contact of the first semiconductor device through an electrical path that goes through a shunt board attached to a switchable interface trace bank, the electrical contact being associated with a position of the electron beam;

evaluating the physical failure analysis model together with the initial semiconductor manufacturing process and, based on the evaluation, revising at least one revised process parameter selected from deposition pressure, deposition temperature, precursor flow rate, or epitaxial-growth duration;

performing a revised semiconductor manufacturing process that incorporates the at least one revised process parameter; and forming, with the revised semiconductor manufacturing process, a second semiconductor device that includes a backside interconnection structure comparable to the backside interconnection structure of the first semiconductor device.

2. The method of claim 1, wherein the directing an electron beam is performed when the first semiconductor device is attached to a device-under-test (DUT) board, the DUT board being in a vacuum chamber.

3. The method of claim 1, wherein the electrical path goes through a connector attached to a backside of a device-under-test (DUT) board, the first semiconductor device and the shunt board being attached to a frontside of the DUT board.

4. The method of claim 1, wherein the electrical path goes through a flexible interconnect cable connected to a backside of a device-under-test (DUT) board.

5. The method of claim 4, wherein the electrical path goes through a door connector that is connected to the flexible interconnect cable, and that extends through a door of a vacuum chamber in which the DUT board is disposed.

6. The method of claim 5, further comprising translating the DUT board by a stage, the DUT board being attached to the stage by a spacer including aluminum.

7. The method of claim 1, wherein the second semiconductor device has the same structure as the first semiconductor device.

8. An apparatus, comprising:

a device-under-test (DUT) board configured to support a first semiconductor device formed by a semiconductor process, the first semiconductor device including a backside interconnection structure;

an electron beam generator configured to direct an electron beam toward a frontside of the first semiconductor device;

an electrical signal source configured to apply an electrical signal to an electrical contact of the first semiconductor device via an electrical path, the electrical path extending through a shunt board attached to a switchable interface trace bank of the DUT board, the electrical contact being associated with a position at which the electron beam impinges;

a controller operatively coupled to the electron beam generator and the electrical signal source and configured to:

receive output signals generated during electron beam irradiation of the first semiconductor device;

generate a physical failure analysis model for the first semiconductor device;

evaluate the physical failure analysis model together with data from the semiconductor process to produce at least one revised process parameter selected from deposition pressure, deposition temperature, precursor flow rate, or epitaxial-growth duration; and a semiconductor-fabrication tool set comprising one or more deposition chambers, etch chambers, anneal furnaces, or epitaxial-growth chambers, the tool set being operable to execute a revised semiconductor manufacturing process that incorporates the at least one revised process parameter to form a second semiconductor device including a backside interconnection structure comparable to that of the first semiconductor device.

9. The apparatus of claim 8, further comprising a vacuum chamber in which the DUT board is disposed, such that the electron beam is directed toward the first semiconductor device while the DUT board is positioned within the vacuum chamber.

10. The apparatus of claim 8, wherein the electrical path is configured to extend through a connector affixed to a backside of the DUT board, the first semiconductor device and the shunt board being attached to a frontside of the DUT board.

11. The apparatus of claim 8, wherein the electrical path is configured to extend through a flexible interconnect cable connected to a backside of the DUT board.

12. The apparatus of claim 11, wherein the flexible interconnect cable is further connected to a door connector that extends through a door of a vacuum chamber in which the DUT board is disposed.

13. The apparatus of claim 8, further comprising a stage configured to translate the DUT board, the DUT board being attached to the stage by a spacer comprising aluminum.

14. The apparatus of claim 8, wherein the semiconductor processing module is configured to form the second semiconductor device having the same structure as the first semiconductor device.

15. A method for generating a revised semiconductor process, comprising:

providing a first semiconductor device having a backside interconnection structure, the first semiconductor device being produced by an initial semiconductor process;

performing an inspection process comprising:

directing an electron beam toward a selected region on a frontside of the first semiconductor device; and concurrently applying an electrical signal to an electrical contact associated with the selected region through an electrical path extending through a shunt board coupled to a switchable interface trace bank;

generating a physical failure analysis model for the first semiconductor device based on responses elicited during the inspection process;

evaluating the physical failure analysis model together with the initial semiconductor process and, based on the evaluation, revising at least one revised process parameter selected from deposition pressure, deposition temperature, precursor flow rate, or epitaxial-growth duration; and executing a revised semiconductor manufacturing process that incorporates the at least one revised process parameter to fabricate a second semiconductor device having a backside interconnection structure comparable to that of the first semiconductor device.

16. The method of claim 15, wherein the first semiconductor device is mounted on a DUT board situated in a vacuum chamber during the inspection process.

17. The method of claim 15, wherein the electrical path further comprises a door connector configured to extend through a door of a vacuum chamber.

18. The method of claim 15, wherein the inspection process further comprises calibrating a loopback time delay along the electrical path using time domain reflectometry.

19. The method of claim 15, wherein the parameter for the revised semiconductor process adjusts at least one of deposition temperature, chamber pressure, or precursor flow rate.

20. The method of claim 15, wherein the second semiconductor device is formed with a structure substantially identical to the first semiconductor device.

* * * * *